United States Patent [19]
Fujikata et al.

[11] 4,161,700
[45] Jul. 17, 1979

[54] ANALOG COMPARATOR

[75] Inventors: Kenji Fujikata, Hachioji; Norio Yokozawa, Fuchu; Akinori Shibayama, Tokyo, all of Japan

[73] Assignees: Hitachi, Ltd.; Nippon Telegraph and Telephone Public Corporation, both of Japan

[21] Appl. No.: 853,885

[22] Filed: Nov. 22, 1977

[30] Foreign Application Priority Data

Dec. 10, 1976 [JP] Japan .................................. 51-148403

[51] Int. Cl.$^2$ .......................................... H03K 5/153
[52] U.S. Cl. ..................................... 328/147; 307/228; 307/360; 307/362
[58] Field of Search ....................... 307/228, 360, 362; 328/146–148, 185

[56] References Cited

U.S. PATENT DOCUMENTS

| 3,214,700 | 10/1965 | Hook | 307/360 X |
| 3,309,614 | 3/1967 | Schlein | 307/360 X |
| 3,659,208 | 4/1972 | Fussell | 307/360 X |

Primary Examiner—John Zazworsky
Attorney, Agent, or Firm—Craig & Antonelli

[57] ABSTRACT

An analog comparator comprising a generator circuit which generates an input signal voltage having a certain slew rate, a setting circuit which sets a target or desired voltage, another setting circuit which sets a threshold voltage corresponding to the slew rate of the input signal voltage and an ambient temperature, and a comparison circuit which receives the input signal voltage, the target voltage and the threshold voltage and which delivers a coincidence timing signal upon detecting that the input signal voltage has reached a voltage shifting by the threshold voltage from the target voltage.

8 Claims, 7 Drawing Figures

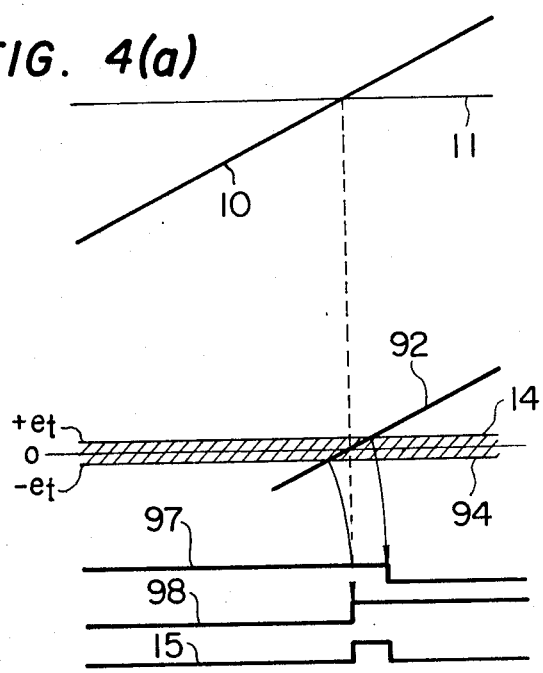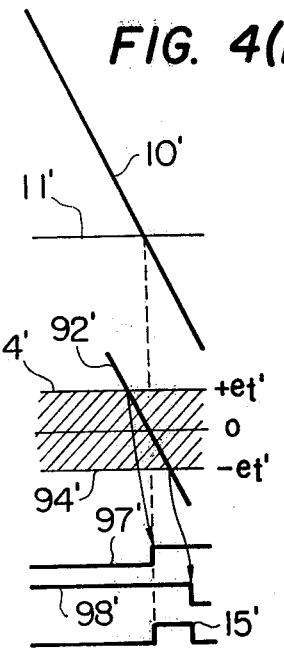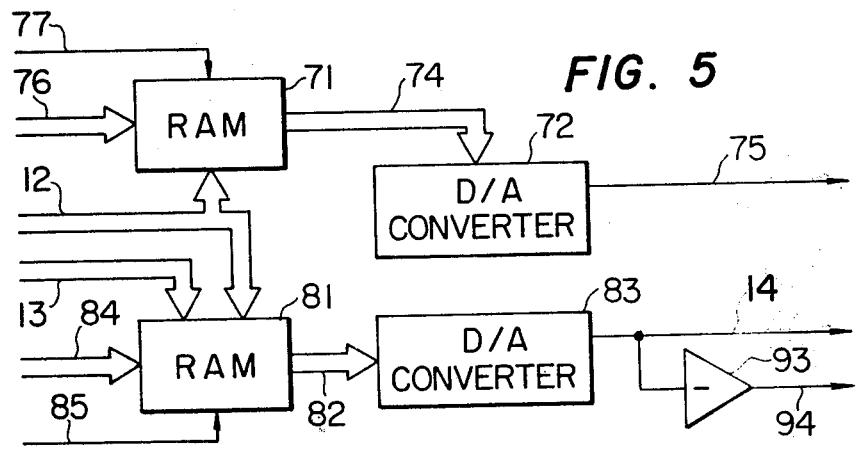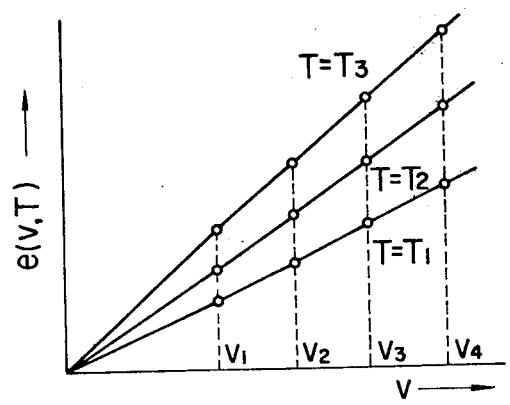

ANALOG COMPARATOR

BACKGROUND OF THE INVENTION

1. Field of the Invention

This invention relates to an analog comparator for detecting if an input signal voltage has reached a target or desired voltage as predetermined.

2. Description of the Prior Art

As an analog comparator of this type, there has been known one wherein a predetermined threshold voltage with the time delay of the circuit taken into account is set, it is detected that an input signal voltage having a certain slew rate has reached a voltage shifting by the predetermined threshold voltage from a target or desired voltage, and a coincidence timing signal representing that the input signal voltage has reached the target voltage is provided upon the detection.

In such an analog comparator, the threshold voltage has heretofore been fixed. In this case, a detection error in the time of arrival at the target voltage has developed in, for example, a use in which the slew rate, i.e., the slope of the input signal voltage changes sharply or a use in which the change of the threshold value ascribable to an ambient temperature change or the lapse of time becomes a problem.

More specifically, let it be supposed that an input signal voltage of comparatively low slew rate and an input signal voltage of comparatively high slew rate are respectively entered into the analog comparator having the predetermined threshold voltage with respect to the target voltage. In the former case, the input signal voltage reaches the target voltage in a comparatively long period of time $t_{d1}$ after entering the threshold voltage. In the latter case, it reaches the target voltage in a comparatively short period of time $t_{d2}$. Accordingly, in the case where the threshold voltage is set so that the period of time $t_{d1}$ may become equal to a circuit delay time $t_d$, the coincidence signal is correctly provided for the former, but the provision of the coincidence signal lags for the latter. Therefore, the detection error in the time of the arrival at the target voltage occurs.

Due to the change of the ambient temperature or the lapse of time, the threshold value changes, and the detection point fluctuates. Accordingly, the detection error in the time of the arrival at the target voltage takes place in a manner similar to that discussed above.

SUMMARY OF THE INVENTION

An object of this invention is to provide an analog comparator which can accurately detect the time when an input signal voltage has arrived at a target or desired voltage.

In order to accomplish this and other objects, this invention is characterized by providing an analog comparator wherein a threshold voltage is varied in correspondence with, at least, the slew rate of the input signal voltage, so that the period of time in which the input signal voltage having entered a threshold voltage region reaches the target voltage is made constant for any input signal voltage.

These and other objects, features and beneficial results of this invention will become apparent from the following description taken with reference to the accompanying drawings showing the embodiments of this invention.

BRIEF DESCRIPTION OF THE DRAWINGS

FIGS. 4(a) and 4(b) are time charts for elucidating the operation of the circuit arrangement in FIG. 3.

FIG. 5 is a circuit diagram of an example in which a circuit for writing information is added to the random access memories in the circuit arrangement in FIG. 3.

FIG. 6 is a characteristic diagram showing the relations between the threshold value and the slope of an input signal as well as the ambient temperature.

DETAILED DESCRIPTION OF THE PREFERRED EMBODIMENT

Figure 1:
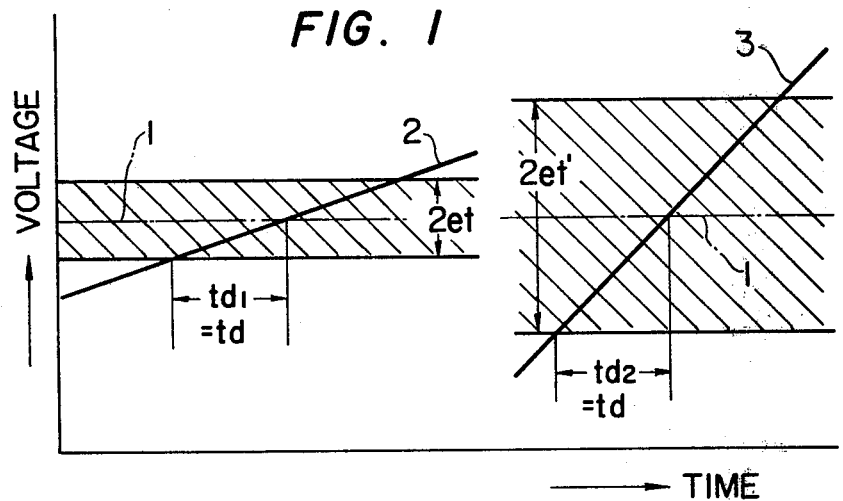
FIG. 1 is an explanatory view for elucidating the principle of this invention.

FIG. 1 is a diagram for explaining the principle of an analog comparator according to this invention.

In the figure, numerals 2 and 3 designate input signal voltages which are entered into the comparator and whose slew rates are different from each other. Threshold voltages $e_t$ and $e_t'$ corresponding to the slew rates are set so that both the periods of time $t_{d1}$ and $t_{d2}$ in which the input signal voltages 2 and 3 having entered regions between-threshold-voltages set in the comparator and hatched in the figure reach a target or desired value voltage 1, respectively, may become equal to the time delay $t_d$ of the comparator. Thus, the comparator is operated.

More specifically, the threshold voltage $e_t$ is varied in association with (dE/dt) so as to fulfill the following relation with respect to an input signal amplitude E:

$$(dE/dt) \cdot t_d = e_t$$

In case where the time delay $t_d$ or the threshold value of the comparator fluctuates on account of a change in the ambient temperature, etc., the threshold voltage $e_t$ should desirably be varied so as to compensate for the fluctuation.

Figure 2:
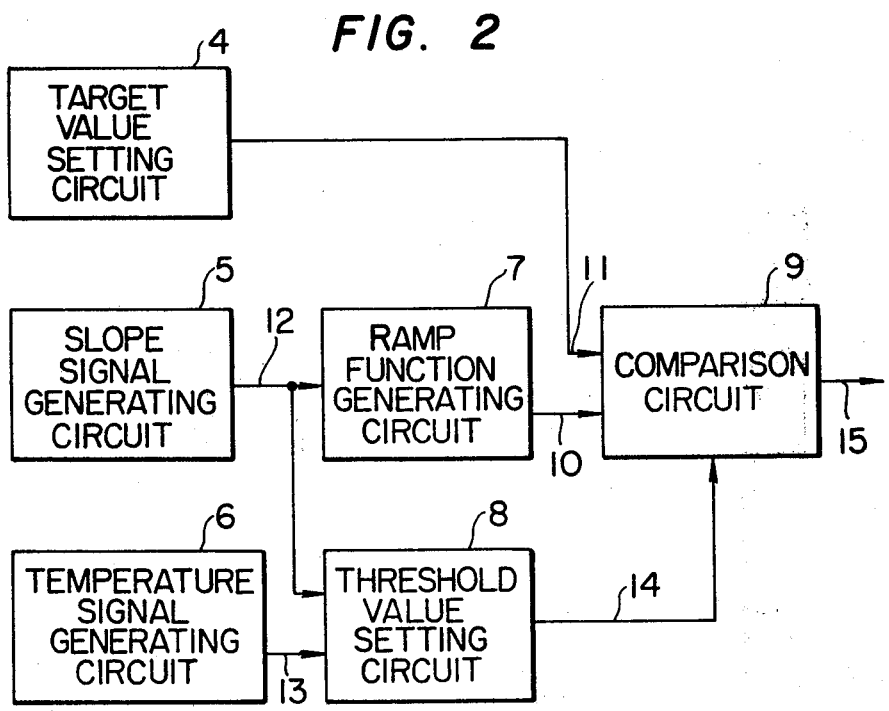
FIG. 2 is a schematic block diagram of an embodiment of the analog comparator according to this invention.

FIG. 2 shows an embodiment of this invention, which is an analog comparator for detecting that a ramp function whose slope can be arbitrarily set has reached a predetermined voltage. That is, the fact that the ramp function 10 generated by a ramp function generating circuit 7 has reached a target or desired value 11 is detected by means of a threshold value setting circuit 8 which can set a threshold value corresponding to the slope of the ramp function and the ambient temperature, and a comparison circuit 9 whose threshold value is variable. Numeral 4 indicates a target or desired value setting circuit for generating the predetermined target voltage 11, numeral 5 a slope signal generating circuit for generating a signal 12 which designates the slope of the ramp function, and numeral 6 a temperature signal generating circuit for occasionally detecting the ambient temperature and generating a signal 13 which designates the temperature.

Figure 3:
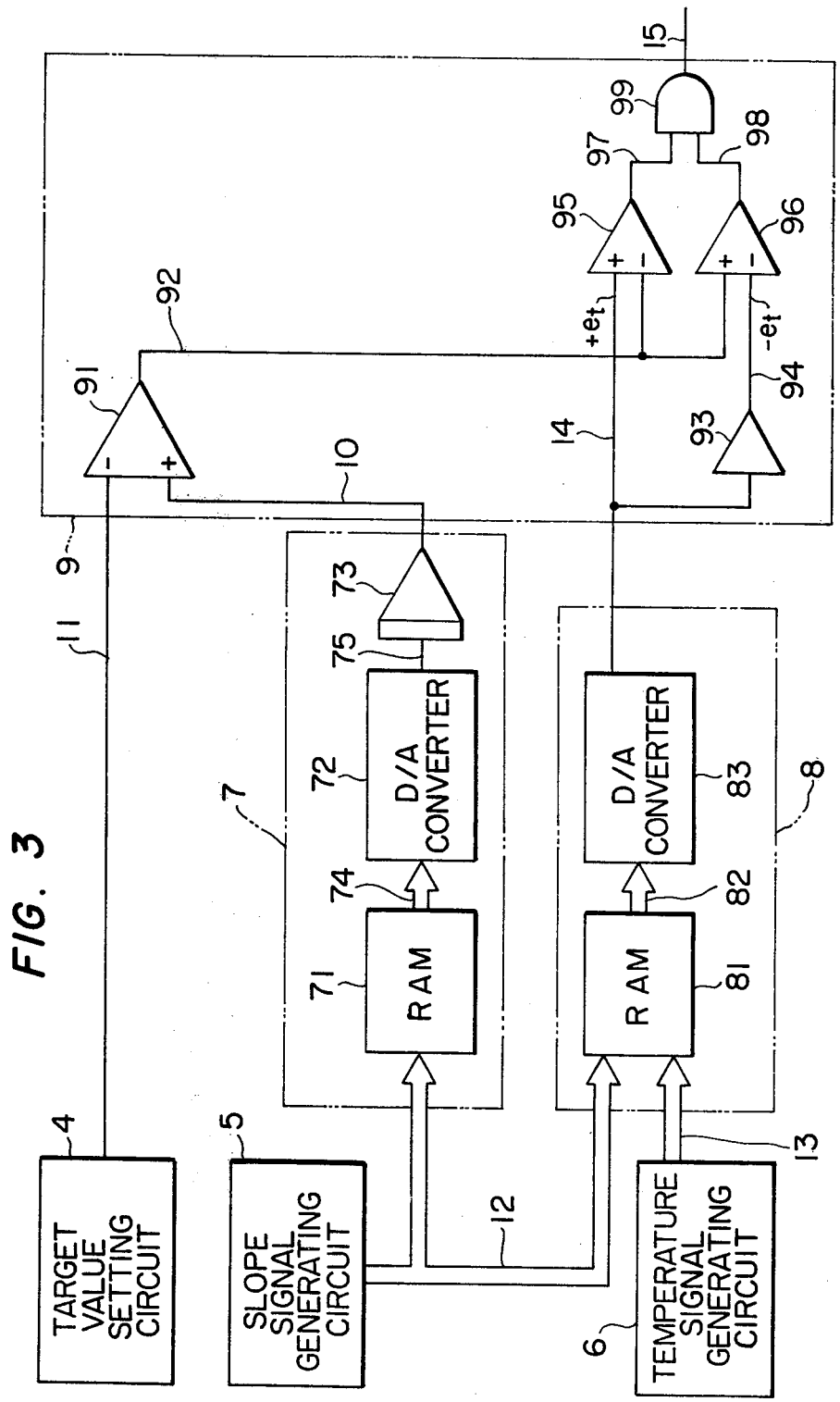
FIG. 3 is a circuit diagram showing an example of the concrete arrangement of the embodiment in FIG. 2.

FIG. 3 shows the analog comparator of FIG. 2 in detail. The ramp function generating circuit 7 consists of a random access memory (RAM) 71 which generates a digital signal 74 corresponding to the slew rate of the ramp function by using as an address the digital signal 12 designating the slope of the ramp function, a digitalto-analog (D/A) converter 72 which converts the digital signal 74 into an analog voltage 75, and an integrator 73 which serves to generate the ramp function 10 having the slope corresponding to the analog voltage 75.

The threshold value setting circuit 8 consists of a random access memory 81 which generates a digital signal 82 corresponding to the threshold value by using as an address the signal 12 designating the slope and the signal 13 designating the temperature, and a digital-to-analog (D/A) converter 83 which converts the digital signal 82 into an analog voltage 14.

The comparison circuit 9 consists of a differential amplifier 91 for obtaining a difference signal 92 between the target voltage 11 and the ramp function 10, an inverter 93 for obtaining a threshold voltage of the opposite polarity 94, comparator means 95 and 96 for judging if the difference signal 92 has entered between the positive and negative threshold voltages 14 and 94, and an AND gate 99 for taking the AND between comparison outputs 97 and 98 from the respective comparator means 95 and 96. In case where the difference signal 92 has entered within the threshold voltage region, the comparison circuit 9 delivers a coincidence timing signal 15. Thus, the comparator means 96 provides an output 98 when the output 92 of said differential amplifier 91 is larger than the output 94 of the inverter 93, the comparator 95 provides an output 97 when the threshold signal is larger than the output 92 of the differential amplifier 91, and the AND gate 99 takes an AND between the outputs 97 and 98 of the two comparison means 95 and 96. In FIG. 3, data "write" signals and data "write" control signals of the memories 71 and 81 are omitted.

The operation of the circuit arrangement in FIG. 3 will now be described with reference to a time chart in FIG. 4.

(1) The ramp function 10 corresponding to the slope signal 12 in FIG. 3 and the target value 11 are given as inputs to the comparison circuit 9. At this time, the difference signal 92, the positive threshold voltage 14 and the negative threshold signal 94 become as shown in FIG. 4 on the time chart, respectively.

(2) When the ramp function 10 has entered the hatched range of the threshold value at the target value, the difference signal 92 falls within the range between the positive threshold value 14 and the negative threshold value 94. The outputs 97 and 98 of the respective comparator means 95 and 96 involve time lags etc., and become detection signals indicated by the same numerals at (a) in FIG. 4 respectively. They are converted by the AND gate 99 into the coincidence timing signal 15 whose rise indicates the timing of the coincidence of the ramp function 10 with the target value 11.

(3) In case where the slope of the ramp function 10 has become steep, threshold voltages 14' and 94' are respectively expanded into $e_t'$ and $-e_t'$ as shown at (b) in FIG. 4, whereby the output of a coincidence timing signal 15' rises at the timing at which a ramp function 10' has coincided with a target value 11' after the delay time of the comparator.

In this manner, the slope signal 12 is in FIG. 3 changed according to the change of the slope of the ramp function. Thus, it becomes possible to correctly take out the coincidence timing signal.

In the foregoing embodiment, it has been exemplified to set the two, positive and negative threshold values $+e_t$ and $-e_t$ for the target value. However, in case where the direction of increase of an input signal is fixed in one certain direction, either threshold value may be set.

FIG. 5 shows a circuit arrangement in which the "write" function is added to the RAM's 71 and 81 in the embodiment of FIG. 3. It serves to elucidate how the threshold value is designated in response to the change of the slope of the ramp function or the change of the ambient temperature.

(a) First of all, the optimum threshold voltages e(v, T) which take into account a circuit delay in the case where the slope v of the ramp function and the ambient temperature T have changed are evaluated in an expected range of use in advance. The result is illustrated in FIG. 6. On the basis of the result, a table $e(v_m, T_n)$ of sample values of the optimum threshold voltages as indicated by marks in FIG. 6 is prepared. In the example of FIG. 6, m assumes values of 1 to 4 and n assumes values of 1 to 3, and there are 12 sets of sample values in total. In case where the slew rate or ambient temperature being the subject varies continuously, it may be quantized in a predetermined unit, and the respective unit quantities may be made sample values.

(b) The random access memory for designating threshold values, 81 is prepared whose address signals are the sets (m, n) of the slope and the temperature and whose contents are $e(v_m, T_n)$. Concretely, m and n are applied as the address input 12 and the address input 13 of the random access memory 81, respectively, $e(v_m, T_n)$ is applied as a data input 84, and a "write" permitting signal 85 is turned "on", whereby the table of the threshold voltages is written into the random access memory 81.

The random access memory for designating slopes, 71 is similarly prepared in such a way that m is entered as the address signal 12, that $v_m$ is applied as an input data 76, and that a "write" permitting signal 77 is turned "on".

Then, arrangements for using the RAM's 71 and 81 are made.

(c) In order to obtain the threshold voltage corresponding to the slope and temperature, m and n are respectively entered as the address input 12 and the signal 13 of the random access memory for designating threshold values, 81. Thus, the threshold voltage $e(v_m, T_n)$ can be provided at the output terminal 82 as a binary signal. By entering the binary signal into the D/A converter 83, the analog threshold voltage $e(v_m, T_n)$ can be obtained as the output signal 14.

On the other hand, m is entered as the address input 12 into the address terminal of the random access memory for designating slopes, 71. Thus, a binary signal corresponding to the slope can be obtained as the output signal 74. By entering the binary signal into the D/A converter 72, the analog voltage for designating the slope can be obtained as the output signal 75. This voltage becomes the input to the ramp function generating integrator 73, and the ramp function having the designated slope can be generated.

In this way, the threshold value of the comparator can be easily varied in correspondence with the slope of the ramp function and the ambient temperature. Accordingly, even in case where the slope of the ramp function is frequently changed or where the time delay of an element changes due to the change of the ambient temperature, the threshold value control is possible merely by electrically changing parameters (for example, m and n in the explanation of FIG. 5), and it can be readily done with, for example, a computer. In the presence of the parameter change in the circuit with the lapse of time, the change can be coped with by rewriting $e(v_m, T_n)$ into the random access memory 81 and without altering the hardware.

In the above, description has been made of the case where a predetermined value is set as the rate change of a signal. In general, however, it is possible to detect a predetermined rate from a generated function and to use it.

As set forth above, according to this invention, it becomes possible to provide an analog comparator which is capable of a precise level detection even in the presence of a change in the slope of an input signal, a change in the ambient temperature, the parameter change, with the lapse of time etc. As concrete uses, there are applications to a graphic display, a pattern drawing device and a measuring instrument in which an electron beam needs to be precisely set at a target point. The invention serves for rendering the performances of such apparatuses high.

We claim:

1. An analog comparator comprising first means to generate an input signal having a certain slew rate, second means to set a desired target signal, third means to set a threshold signal corresponding at least to said slew rate, and fourth means to receive the signals from said first, second, and third means and to deliver a predetermined timing signal upon detecting that a level of said input signal has reached a signal level falling within a range established between the level of the target signal and the level of the threshold signal.

2. An analog comparator according to claim 1, wherein said third means is means to set the threshold signal corresponding to said slew rate and an ambient temperature.

3. An analog comparator comprising first means to generate a signal representative of a slope of a desired ramp function, second means to generate a ramp function having a slope corresponding to the signal from said first means, third means to set a desired target signal, fourth means to set a threshold signal corresponding at least to the signal from said first means, and fifth means to receive the signals from said second, third and fourth means and to deliver a predetermined timing signal upon detecting that a signal level of said ramp function falls within a range established between the level of the target signal level and the level of the threshold signal.

4. An analog comparator according to claim 3, further comprising sixth means to generate a signal corresponding to an ambient temperature, and wherein said fourth means is means to set the threshold signal corresponding to the signals from said first and sixth means.

5. An analog comparator according to claim 3, wherein said second means comprises a random access memory which receives the signal from said first means as an address and which delivers a corresponding digital signal, a converter which converts the digital signal from said memory into an analog signal, and an integrator which integrates the output of said converter.

6. An analog comparator according to claim 4, wherein said fourth means comprises a random access memory which receives the signals from said first and sixth means as an address and which delivers a corresponding digital signal, and a converter which converts the output of said memory into an analog signal.

7. An analog comparator according to claim 3, wherein said fifth means comprises a differential amplifier which delivers a difference between said ramp function from said second means and said target signal from said third means, an inverter which inverts said threshold signal from said fourth means, first comparison means to provide an output when the output of said differential amplifier is larger than the output of said inverter, second comparison means to provide an output when said threshold signal is larger than the output of said differential amplifier and an AND gate which takes an AND between said outputs of said first and second comparison means and provides said predetermined timing signal as an output.

8. An analog comparator according to claim 6, wherein the random access memories of the second and fourth means are prepared so that the fourth means can provide an optimum threshold in response to predetermined values of the signals for the slope of the ramp function and the ambient temperature by providing the random access memories with data inputs corresponding to the optimum thresholds for the predetermined values of slope and temperature and write inputs to permit writing the values on the data inputs into the random access memories.

* * * * *